(12) United States Patent
Nara et al.

(10) Patent No.: US 10,458,424 B2
(45) Date of Patent: Oct. 29, 2019

(54) CENTRIFUGAL FAN

(71) Applicant: Minebea Mitsumi Inc., Nagano (JP)

(72) Inventors: Kiyohisa Nara, Fukuroi (JP); Seiya Fujimoto, Fukuroi (JP)

(73) Assignee: MINEBEA MITSUMI INC., Nagano (JP)

( * ) Notice: Subject to any disclaimer, the term of this patent is extended or adjusted under 35 U.S.C. 154(b) by 201 days.

(21) Appl. No.: 15/630,104

(22) Filed: Jun. 22, 2017

(65) Prior Publication Data

US 2018/0003188 A1 Jan. 4, 2018

(30) Foreign Application Priority Data

Jun. 30, 2016 (JP) .................................. 2016-130804

(51) Int. Cl.
*F04D 29/28* (2006.01)
*F04D 29/02* (2006.01)
*F04D 25/06* (2006.01)
*F04D 29/58* (2006.01)
*F04D 17/16* (2006.01)
(Continued)

(52) U.S. Cl.
CPC ........... *F04D 29/281* (2013.01); *F04D 17/16* (2013.01); *F04D 25/06* (2013.01); *F04D 25/0613* (2013.01); *F04D 29/023* (2013.01); *F04D 29/5813* (2013.01); *F04D 29/626* (2013.01); *H01L 23/467* (2013.01)

(58) Field of Classification Search
CPC .... F04D 25/0613; F04D 29/281; F04D 25/06; F04D 29/023; F04D 29/282; F04D 29/4226; F04D 29/626
See application file for complete search history.

(56) References Cited

U.S. PATENT DOCUMENTS 4,505,532 A * 3/1985 Hine .................... H05K 7/1084
174/DIG. 8
4,987,736 A * 1/1991 Ciokajlo ................. F01D 9/065
415/138
(Continued)

FOREIGN PATENT DOCUMENTS

JP H07-004390 A 1/1995
JP 2000-045992 A 2/2000
(Continued)

OTHER PUBLICATIONS

Notification of Reason for Refusal dated Sep. 26, 2018 in a corresponding Japanese application No. 2016-130804.
(Continued)

*Primary Examiner* — Dominick L Plakkoottam
(74) *Attorney, Agent, or Firm* — Pearne & Gordon LLP

(57) ABSTRACT

There is provided a centrifugal fan that effectively cools an electronic component with a simple structure. The centrifugal fan comprises an impeller 8 having a plurality of pins extending in an axial direction, a rotor yoke 18 formed with a plurality of through-holes through which the pins penetrate, the rotor yoke 18 being joined to the impeller 8 as the pins penetrate through the through-holes, and a circuit board 10 arranged in a state having a gap with respect to the rotor yoke 18, wherein an end 11c' of the pin protrudes from the rotor yoke to a side of the circuit board, and the plurality of pins are arranged with uneven pitch in a circumferential direction of the impeller.

5 Claims, 4 Drawing Sheets

(51) Int. Cl.
  *F04D 29/62*   (2006.01)
  *H01L 23/467*  (2006.01)

(56)  References Cited

U.S. PATENT DOCUMENTS

| | | | |
|---|---|---|---|
| 6,139,275 A | 10/2000 | Noda et al. | |
| 2009/0263232 A1* | 10/2009 | Jarrah | F04D 25/0613 |
| | | | 415/4.4 |
| 2010/0215527 A1* | 8/2010 | Suzuki | F04D 25/0613 |
| | | | 417/423.14 |
| 2013/0323040 A1* | 12/2013 | Fujita | F04D 29/4226 |
| | | | 415/200 |
| 2015/0377238 A1* | 12/2015 | Fujimoto | F04D 29/281 |
| | | | 417/423.7 |
| 2016/0265543 A1 | 9/2016 | Fujita | |

FOREIGN PATENT DOCUMENTS

| | | |
|---|---|---|
| JP | 2013-245658 A | 12/2013 |
| JP | 2016-011627 A | 1/2016 |

OTHER PUBLICATIONS

Japanese Office Action for Application No. 2016130804, dated Apr. 2, 2019.

* cited by examiner

CENTRIFUGAL FAN

CROSS REFERENCE TO RELATED APPLICATIONS

This application claims the benefit of Japanese Patent Application No. 2016-130804, filed Jun. 30, 2016, which is hereby incorporated by reference in its entirety.

BACKGROUND

Technical Field

The present invention relates to a centrifugal fan characterized by a function of cooling a built-in electronic component.

Background

Centrifugal fans have been widely used for purposes including cooling, ventilation, air conditioning of various equipment including home electrical equipment, OA equipment, and industrial equipment, or for air conditioning, air feeding, or the like for a vehicle. Conventionally, as a centrifugal fan of such a type, there is a centrifugal fan described, for example, in Japanese Patent Application Laid-Open No. 2016-011627. The centrifugal fan of such a type includes an impeller and a rotor yoke joined to the impeller. For example, in Japanese Patent Application Laid-Open No. 2013-245658 a centrifugal fan is described having a means of joining an impeller and a rotor yoke. In the centrifugal fan of Japanese Patent Application Laid-Open No. 2013-245658, a resin pin integrally formed on the lower surface of the impeller is inserted into a through-hole formed through a rotor yoke, and the end of the resin pin is thermally caulked so that the impeller is joined to the rotor yoke.

The centrifugal fan of Japanese Patent Application Laid-Open No. 2016-011627 includes various electronic components mounted on a circuit board that is accommodated in a recessed portion formed on a motor base made of a metal material. The electronic components include a component (for example, a switching element, e.g., an FET) that tends to generate heat. It is preferable to cool such a component in order to prevent deterioration or malfunction of the electronic component due to heat generation. When the means of joining an impeller and a rotor yoke described in Japanese Patent Application Laid-Open No. 2013-245658 is used in the centrifugal fan of Japanese Patent Application Laid-Open No. 2016-011627, convection of air would be generated by projections protruding from the lower surface of the rotor yoke, thereby making a contribution to cooling the electronic component. It cannot, however, be said that the cooling effect is sufficient.

In light of the foregoing background, it is an object of the present invention to provide a centrifugal fan that effectively cools an electronic component with a simple structure.

SUMMARY

The present invention is a centrifugal fan including an impeller having a plurality of pins extending in an axial direction, a rotor yoke formed with a plurality of through-holes through which the pins penetrate, the rotor yoke being joined to the impeller as the pins penetrate through the through-holes, and a circuit board arranged in a state having a gap with respect to the rotor yoke, wherein an end of the pin protrudes from the rotor yoke to a side of the circuit board, and the plurality of pins are arranged uneven pitch in a circumferential direction of the impeller.

According to the present invention, a structure is preferable in which an electronic component on the circuit board and a part of the pin protruding to the side of the circuit board are positioned to overlap with each other when viewed from a direction perpendicular to a rotation axis.

According to the present invention, a centrifugal fan that effectively cools an electronic component with a simple structure is obtained.

DETAILED DESCRIPTION

Figure 1:
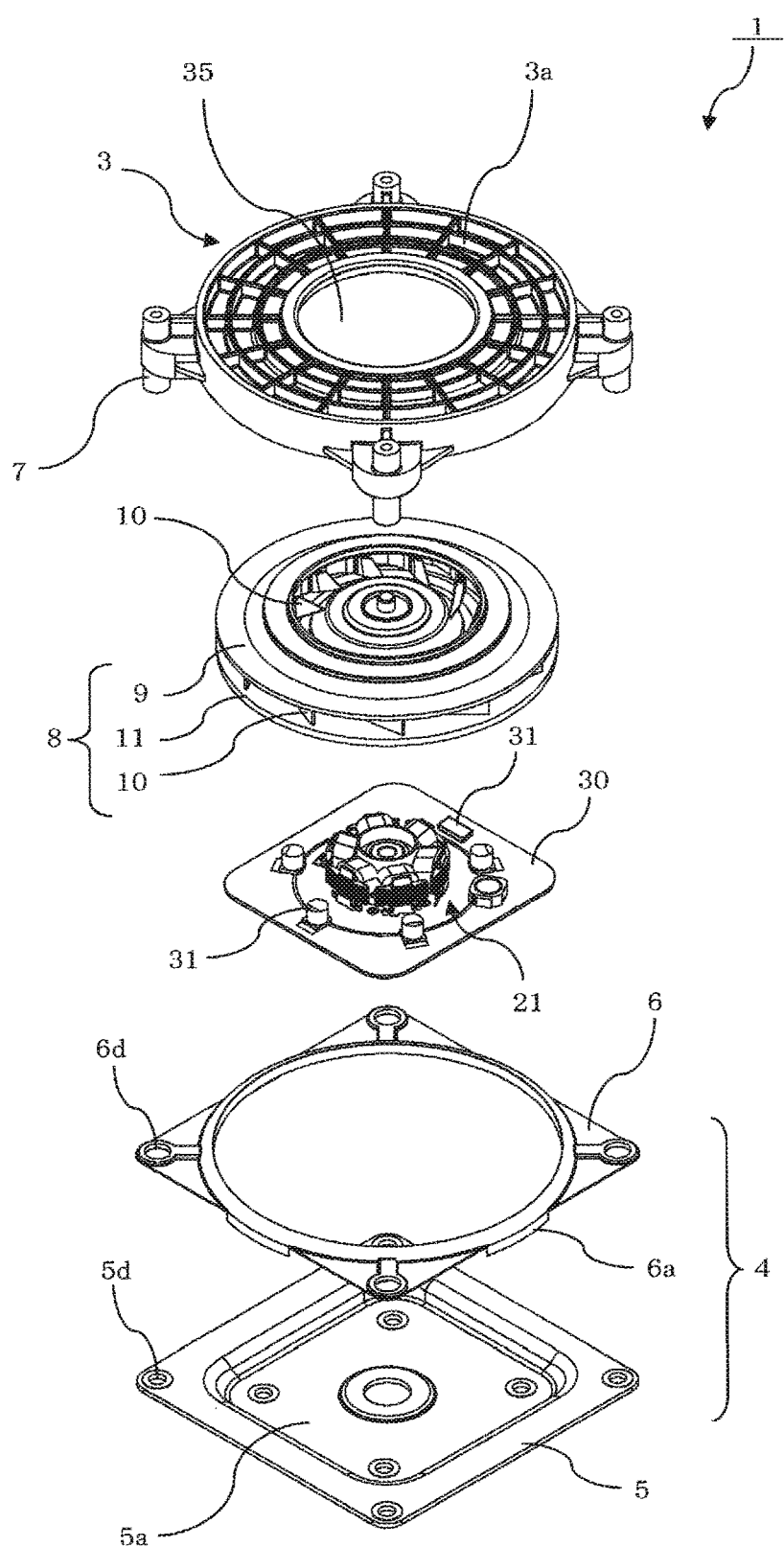
FIG. 1 is an exploded perspective view of a centrifugal fan according to an embodiment.
Figure 2:
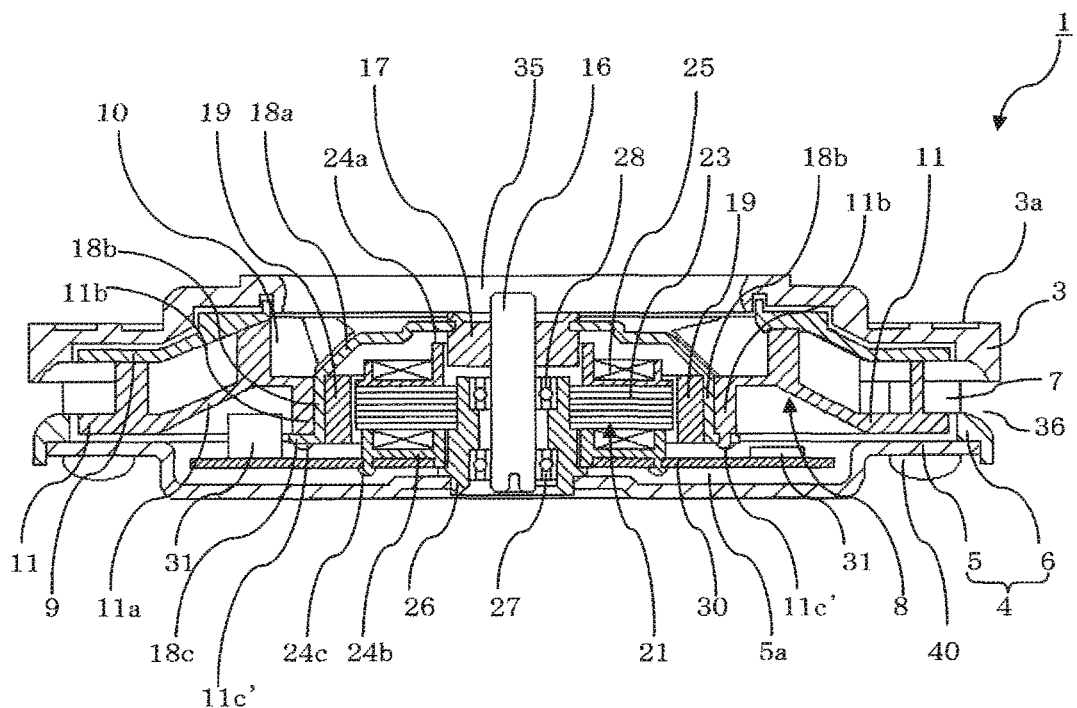
FIG. 2 is a cross-sectional view of the centrifugal fan according to the embodiment.

A centrifugal fan according to an embodiment using the invention is described below. FIGS. 1 and 2 illustrate a centrifugal fan 1. The centrifugal fan 1 includes a casing 2, which is composed of an upper casing 3 and a lower casing 4. The casing 2 includes therein a motor 21 and an impeller 8 rotated by the motor 21.

The impeller 8 is accommodated in a rotatable state between the upper casing 3 and the lower casing 4. The rotation of the impeller 8 causes air to be sucked into the impeller 8 through an inlet port 35 which is formed through the upper casing 3. The sucked air passes through between vanes 10 of the impeller 8 and is discharged outward (radially outward) with respect to the casing 2 through outlet ports 36 formed through the side surface of the casing 2. The outlet ports 36 are formed between a plurality of (four in this case) struts 7 having a cylindrical shape, which are interposed between the upper casing 3 and the lower casing 4.

The lower casing 4 has a structure in which a motor base 5 made of metal (e.g., a steel plate) formed with a recess 5a having a rectangular shape at a central portion and a base plate 6 made of a resin are stacked together. A bearing retaining portion 26 having a substantially cylindrical shape is fixed at the center of the motor base 5. A shaft 16, which serves as a rotation axis, is rotatably supported on the inner side of the bearing retaining portion 26 via bearings 27, 28.

The motor 21, which is an outer rotor-type brushless DC motor, is attached to the bottom surface of the recess 5a of the motor base 5. The motor 21 includes a lower insulator 24b constituting an insulator 24 to be described below, and a circuit board 30 is fixed to the lower surface of the lower insulator 24b. The ends of pins integrally molded with the lower insulator 24b and protruding downward are thermally caulked so that the circuit board 30 is connected to the lower insulator 24b. FIG. 2 illustrates a thermally caulked portion 24c.

A stator 22 constituting the motor 21 is fixed on the outer side of the bearing retaining portion 26. The stator 22 is composed of a stator core 23 formed as a predetermined number of thin plate-shaped cores, e.g., steel plates, made of a soft magnetic material, are stacked, the insulator 24 consisting of an upper insulator 24a and the lower insulator 24b, which are made of a resin and attached from both axial sides of the stator core 23, and a coil 25 wound on the teeth of the stator core 23 via the insulator 24.

The thin plate-shaped cores constituting the stator core 23 include teeth (the centrifugal fan 1 includes six teeth), which extend from an annular yoke radially outward. The cores are stacked to constitute the stator core 23. The stator core 23 is formed with an opening at the center, and the bearing retaining portion 26 is fit to the opening. A lower part of the stator 22 (a lower side part of the coil 25) and the circuit board 30 are in a state being accommodated in the recess 5a of the motor base 5, thereby achieving a reduction in the axial dimension, i.e., a reduction in thickness.

As illustrated in FIG. 1, side portions 6a extending downward are formed at four points on the outer circumferential end of the base plate 6. The inner sides of the side portions 6a contact the outer circumferences of the four sides of the motor base 5, so that the motor base 5 and the base plate 6 are positioned with respect to each other.

Figure 3:
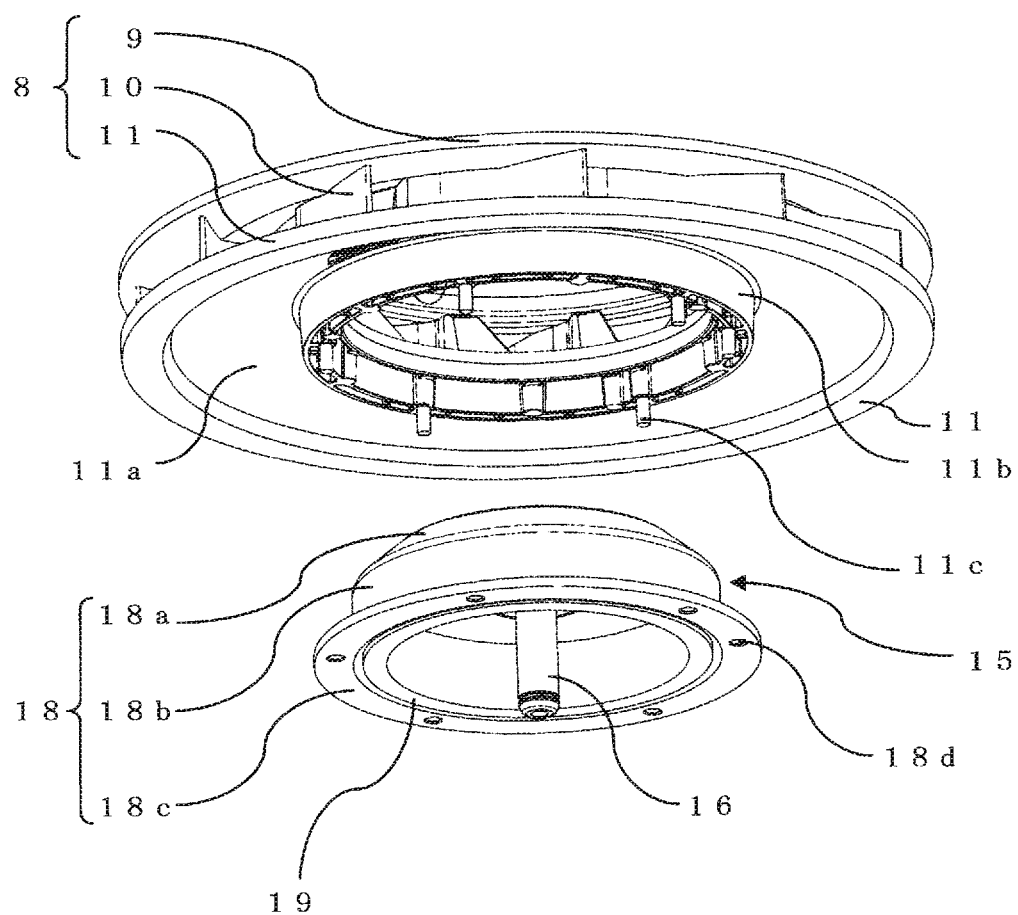
FIG. 3 is a perspective view of an impeller and a rotor yoke according to the embodiment.

The motor 21 is composed of the stator 22 and a rotor 15. FIG. 3 illustrates the rotor 15. The rotor 15 is composed of the shaft 16, a boss portion 17 (see FIG. 2) attached to the shaft 16, a rotor yoke 18 having a cylindrical cup shape fixed to the boss portion 17 by caulking, and an annular magnet 19 fixedly secured to the inner side of the rotor yoke 18. As illustrated in FIG. 2, in an assembled state, the inner circumferential surface of the annular magnet 19 faces the outer circumferential surfaces of the teeth of the stator core 23 in a state having a gap.

As illustrated in FIG. 3, the rotor yoke 18 includes a conical portion 18a, a cylindrical portion 18b axially extending from the outer edge of the conical portion 18a, and a flange portion 18c extending from the lower edge of the cylindrical portion 18b radially outward. The upper part of the conical portion 18a has a disk shape and is formed with an opening at the center thereof, and the boss portion 17 (see FIG. 2) is fit to and fixed in the opening.

The rotor 15 and the impeller 8 are joined with the flange portion 18c. The joining structure will be described later. The impeller 8 is composed of a shroud 9 having an annular shape, the vanes 10, and a main plate 11 having a disk shape. The vanes 10 and the main plate 11 are formed of a resin by integral molding, and they are connected to the shroud 9 which is molded of a resin.

The vanes 10 are formed to erect from the main plate 11 in the axial direction. The vanes 10 have a shape which is curved and inclined backward relative to the rotation direction, i.e., a structure in which vanes are inclined backward relative to the rotation direction (so-called, a turbo type). The vanes 10 all have the same shape. The vanes 10 and the shroud 9 are connected, for example, by ultrasonic welding. The impeller 8 may be molded by a two-color molding technique using resin materials of different types.

The main plate 11 of the impeller 8 has an inner circumferential-side region and an outer circumferential-side region. The inner circumferential-side region is positioned axially above the outer circumferential-side region. Furthermore, the inner circumferential-side portion and the outer circumferential-side portion are linked by an inclined portion 11a. The vanes 10 are erected on the outer circumferential-side portion. An inner circumferential cylindrical portion 11b is formed in a suspending state on the innermost circumference of the main plate 11. The cylindrical portion 18b of the rotor yoke 18 is fixed on the inner side of the inner circumferential cylindrical portion 11b, and the annular magnet 19 is fixed on the inner side of the cylindrical portion 18b.

As illustrated in FIG. 3, pins 11c extending in the axial direction (extension direction of the shaft 16) are formed on the lower end of the inner circumferential cylindrical portion 11b of the main plate 11. The main plate 11 is made of a resin, and the pins 11c are integrally formed with the main plate 11 by means of integral molding using a resin as a material. In this example, the number of pins 11c is six. The six pins 11c are arranged with uneven pitch in the circumferential direction. The pins 11c are fit to through-holes 18d which are formed through the flange portion 18c of the rotor yoke 18 in such a manner that the ends of the pins 11c pass through the through-holes 18d in a protruding state. When the end parts of the pins 11c protruding from the through-holes 18d are subjected to caulking fixation by thermal caulking or infrared caulking, the pins 11c are fixedly secured to the flange portion 18c so that the rotor 15 and the impeller 8 are joined. When the caulking fixation is performed, the end parts of the pins 11c protruding from the through-holes 18d to the side of the circuit board 30 are crushed and form protrusions 11c' of FIG. 2. In this example, the protrusions 11c' are shaped to have a rounded, hemispherical surface.

In the case of thermal caulking, the end parts of the pins 11c protruding from the through-holes 18d are swaged by being pressed and crushed by a heated punch, and form the protrusions 11c' having a hemispherical shape. In the case of infrared caulking, the end parts of the pins 11c protruding from the through-holes 18d are heated by infrared rays and pressed by a punch so that the end parts are crushed and swaged, and form the protrusions 11c' having a hemispherical shape.

The rotor yoke 18 and the main plate 11 are connected by the caulking fixation using the aforementioned pins 11c, so that the rotor 15 and the impeller 8 are joined. With this structure, the impeller 8 is rotated together with the rotor 15 which is rotated by being driven by the motor 21 about the shaft 16 as a rotation axis.

As illustrated in FIG. 1, recesses 3a (reduced thickness portions) are formed on the upper surface side of the upper casing 3. The struts 7 are formed at a plurality of (four in this case) circumferentially equal points on the outer circumference of the upper casing 3. The struts 7 are formed of a resin by integral molding with the upper casing 3. Through-holes 5d, 6d are respectively formed through the four corners of the motor base 5 and the base plate 6, which have a rectangular shape and constitute the lower casing 4, at the points corresponding to the struts 7. Tapping screws 40 (see FIG. 2) are made to penetrate through the through-holes 5d, 6d from below, and their ends are screwed and fastened in the struts 7 having a cylindrical shape, so that the upper casing 3 and the lower casing 4 are joined. The fastening means is not limited thereto, but may, for example, be a means in which bolts inserted into the struts 7 from the lower casing 4 side are fastened with nuts from the upper casing 3 side.

As illustrated in FIG. 2, electronic components 31, e.g., a component for driving and controlling the motor 21 and a control IC are mounted on the circuit board 30. Therefore, for prevention of contact between the electronic components 31 and the impeller 8 in a limited space, the main plate 11 includes the inclined portion 11a. Some of the electronic components 31 are accommodated in the position under the inclined portion 11a, thereby preventing contact between the electronic components 31 and the impeller 8 and achieving a reduction in thickness.

In the present embodiment, the pins 11c made of a resin are arranged unevenly in the circumferential direction of the impeller (in a not evenly arranged state). When the pins 11c are arranged unevenly, convection of air easily occurs over the circuit board 30. As a result, the effect of cooling the electronic components 31 mounted on the circuit board 30 is increased. The centrifugal fan 1 is a thin fan in which the distance between the circuit board 30 and the flange portion 18c of the rotor yoke 18 is short. Therefore, a wiring pattern is formed, but no electronic components 31 are mounted on an area of the circuit board 30 corresponding to the lower surface of the flange portion 18c.

The cooling effect resulting from the pins 11c arranged at circumferentially uneven intervals is described below.

Example

A sample in which the number of pins 11c was six, and the intervals of adjacent pins 11c were at angles of about 32.7°, about 65.4°, about 65.4°, about 65.4°, about 65.4°, and about 65.4° was created as Example with the structure (FIGS. 1 to 3) of the aforementioned embodiment. This sample was obtained by removing some of the pins 11c according to a comparative example (the number of pins 11c is 11 at intervals of about 32.7°) to be described below. A configuration in which the number of pins 11c is reduced to six as some protrusions are removed after caulking may be used. In addition, a mold for manufacturing the main plate 11 may be used, with which a configuration such that the pins 11c are unevenly arranged is molded.

Comparative Example 1

Figure 4:
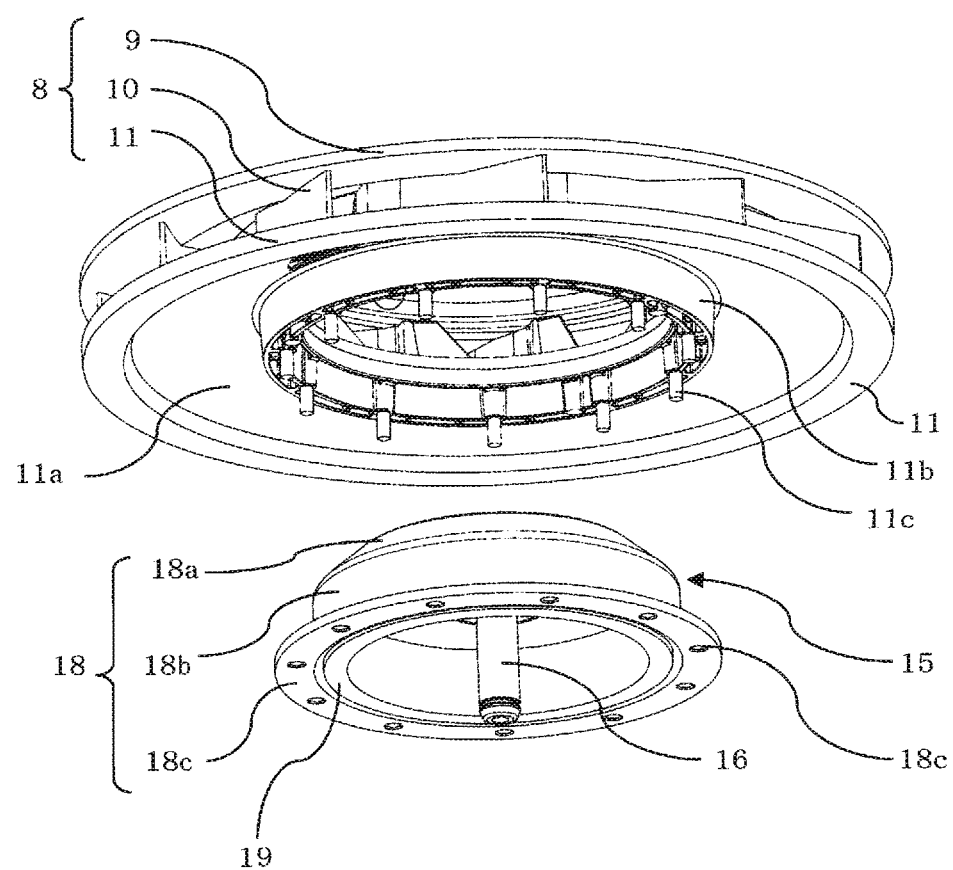
FIG. 4 is a perspective view of an impeller and a rotor yoke according to a comparative example.

A sample with a structure in which the number of pins 11c was 11, they were arranged evenly (evenly arranged about every 32.7°), and furthermore the parts of the pins 11c protruding from the through-holes 18d were all eliminated was produced as Comparative Example 1 with the structure (FIGS. 1 to 3) of the aforementioned embodiment. FIG. 4 illustrates a perspective view of the sample of Comparative Example 1 in a state before the rotor yoke 18 and the main plate 11 are connected.

Comparative Example 2

A sample with a structure in which the number of pins 11c was 11, they were arranged evenly (evenly arranged every about 32.7°), and furthermore the parts of the pin 11c protruding from the through-holes 18d were left as they were was produced as Comparative Example 2 with the structure (FIGS. 1 to 3) of the aforementioned embodiment. FIG. 4 illustrates a perspective view of the sample of Comparative Example 1 in a state before the rotor yoke 18 and the main plate 11 are connected.

(Comparative Experiment)

The results of measurements of the surface temperature of the electronic component 31 (FET) in the operation of the centrifugal fans of Comparative Example 1, Comparative Example 2, and Example (the structure of FIG. 2) under the same conditions are indicated in Table 1.

TABLE 1

|  | Comparative Example 1 | Comparative Example 2 | Example |
|---|---|---|---|
| Number of projections | None | 11 (evenly arranged) | 6 (unevenly arranged) |
| Measured temperature (° C.) | 29.1 | 28.3 | 27.8 |

Temperature of measurement environment: 23.0° C.

As indicated in Table 1, the structure of Example has the largest cooling effect on the electronic component 31, and the cooling effect of Comparative Example 2 is inferior thereto. In addition, the cooling effect of Comparative Example 1 is even inferior to that of the Comparative Example 2.

Causes for the results are examined below. The rotor yoke 18 integrated with the impeller 8 is rotated relative to the circuit board 30 during the operation of the centrifugal fan 1. Since the distance between the circuit board 30 and the flange portion 18c of the rotor yoke 18 is short, the end portions 11c' repeatedly pass in the vicinity of the circuit board 30 during the rotation of the impeller 8. At this time, since, in Example, the end portions 11c' protruding from the lower surface of the flange portion 18c are arranged, convection of air occurs over the mounting surface of the circuit board 30. Furthermore, since the end portions 11c' are arranged unevenly, convection is promoted by air pressure differences. Thus, it is presumed that the effect of cooling the mounting surface of the circuit board 30 is large.

In Comparative Example 2, the presence of the end portions 11c' protruding from the lower surface of the flange portion 18c results in occurrence of convection over the mounting surface of the circuit board 30. Since, however, the end portions 11c' are arranged evenly, the influence is smaller than that in the case of Example. As a result, it is presumed that the effect of cooling the mounting surface of the circuit board 30 is smaller than that of Example. Furthermore, Comparative Example 1 does not have end portions that protrude from the lower surface of the flange portion 18c. Therefore, convection hardly occurs over the mounting surface of the circuit board 30. As a result, it is presumed that the effect of cooling the mounting surface of the circuit board 30 is even smaller than that of Comparative Example 2.

In Example, the end portions 11c' of the pins 11c are positioned to overlap with the electronic components 31 when viewed from a direction perpendicular to the axis (shaft 16), and the circuit board 30 is in close proximity to the end portions 11c' of the pins 11c, which have been subjected to caulking fixation, in areas where the electronic components 31 are absent. With this structure, turbulence of airflow caused by the end portions 11c' effectively occurs between the flange portion 18 and the circuit board 30, and the cooling effect is obtained effectively.

(Other)

Points to be subjected to the caulking fixation are determined by a required fastening force. Therefore, the number of points is not limited to the aforementioned number. In addition, regarding the position of the end portions 11c', it may be configured such that the intervals between adjacent swaged portions all have different values.

It may also be configured such that the end portions 11c' do not have a common shape so that convection occurs more easily. In addition, at least some of the end portions 11c' may have a different protrusion length so that convection occurs more easily. In addition, the end portions 11c' may have an angular (edgy) shape or a fin shape in cross-section so that an airflow mixing effect occurs more prominently.

What is claimed is:

1. A centrifugal fan comprising:
   an impeller having a plurality of pins extending in an axial direction;
   a rotor yoke formed with a plurality of through-holes through which the pins penetrate, the rotor yoke being joined to the impeller as the pins penetrate through the through-holes; and a circuit board arranged in a state having a gap with respect to the rotor yoke, wherein an end of each of the pins protrudes from the rotor yoke to a side of the circuit board, the plurality of pins are arranged with uneven pitch in a circumferential direction of the impeller, and an outer edge of the circuit board extends outside of the pins in a radial direction of the centrifugal fan.

2. The centrifugal fan according to claim 1, wherein an electronic component on the circuit board and a part of each of the pins protruding to the side of the circuit board are positioned to overlap with each other when viewed from a direction perpendicular to a rotation axis.

3. A centrifugal fan comprising:

an impeller having a plurality of pins extending in an axial direction;

a rotor yoke formed with a plurality of through-holes through which the pins penetrate, the rotor yoke being joined to the impeller as the pins penetrate through the through-holes; and a circuit board arranged in a state having a gap disposed along an axis of rotation of the rotor yoke between the rotor yoke and the circuit board, wherein the impeller and rotor yoke are configured to direct air drawn into the impeller radially outwardly at the gap, an end of each of the pins protrudes from the rotor yoke to a side of the circuit board in the gap, and the plurality of pins are arranged with uneven pitch in a circumferential direction of the impeller.

4. The centrifugal fan according to claim 1, wherein the ends of the pins protruding from the rotor yoke have a plurality of different shapes to thereby affect airflow past and between the ends of the pins.

5. The centrifugal fan according to claim 3, wherein the rotor yoke has a cylindrical portion and a flange portion extending outward from an end of the cylindrical portion, and electronic components on the circuit board are arranged outside an area of the circuit board corresponding to the flange portion.

* * * * *